(12) United States Patent
Hsu et al.

(10) Patent No.: US 11,360,392 B2
(45) Date of Patent: Jun. 14, 2022

(54) PHOTOLITHOGRAPHY DEVICE HAVING ILLUMINATOR AND METHOD FOR ADJUSTING INTENSITY UNIFORMITY

(71) Applicant: Taiwan Semiconductor Manufacturing Co., Ltd., Hsinchu (TW)

(72) Inventors: Che-Chang Hsu, Taichung (TW); Chieh-Jen Cheng, Hsinchu (TW); Li-Jui Chen, Hsinchu (TW); Shang-Chieh Chien, New Taipei (TW); Chao-Chen Chang, Taipei (TW); Ssu-Yu Chen, New Taipei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 89 days.

(21) Appl. No.: 16/891,067

(22) Filed: Jun. 3, 2020

(65) Prior Publication Data
US 2021/0033982 A1    Feb. 4, 2021

Related U.S. Application Data

(60) Provisional application No. 62/880,661, filed on Jul. 31, 2019.

(51) Int. Cl.
*G03F 7/20* (2006.01)
*H01L 21/027* (2006.01)

(52) U.S. Cl.
CPC .......... *G03F 7/70075* (2013.01); *G03F 7/702* (2013.01); *G03F 7/70033* (2013.01); *G03F 7/70116* (2013.01); *G03F 7/70191* (2013.01); *G03F 7/70916* (2013.01); *H01L 21/0274* (2013.01)

(58) Field of Classification Search
CPC . H01L 21/0274; G03F 7/70075; G03F 7/702; G03F 7/70033; G03F 7/70058; G03F 7/70066; G03F 7/70083; G03F 7/70091; G03F 7/70116; G03F 7/701; G03F 7/70125; G03F 7/70141; G03F 7/7015; G03F 7/70166; G03F 7/70191; G03F 7/70208; G03F 7/70283; G03F 7/70233; G03F 7/7055; G03F 7/70558; G03F 7/7085; G03F 7/70908; G03F 7/70916; G03F 7/70941; G03F 7/70175
USPC .... 355/30, 52–55, 67–71, 77; 359/627, 850, 359/851, 857–859, 862–863, 868; 250/492.1, 492.2, 492.22, 492.23, 493.1
See application file for complete search history.

(56) References Cited

U.S. PATENT DOCUMENTS

| | | | |
|---|---|---|---|
| 6,225,027 B1 * | 5/2001 | Replogle | G03F 7/702 430/311 |
| 2005/0270513 A1 * | 12/2005 | Dierichs | G03F 7/70108 355/67 |
| 2008/0212059 A1 * | 9/2008 | Warm | G03F 7/70133 355/68 |

(Continued)

*Primary Examiner* — Christina A Riddle
(74) *Attorney, Agent, or Firm* — JCIPRNET

(57) ABSTRACT

An illuminator includes a first facet mirror receiving and reflecting an exposure radiation, an adjustable shielding element disposed on the first facet mirror, the adjustable shielding element adjusting intensity uniformity of the exposure radiation reflected by the first facet mirror, and a second facet mirror receiving and reflecting the exposure radiation reflected by the first facet mirror.

20 Claims, 9 Drawing Sheets

(56) References Cited

U.S. PATENT DOCUMENTS

| | | | |
|---|---|---|---|
| 2011/0063598 A1* | 3/2011 | Fiolka | G03F 7/70083 355/71 |
| 2012/0287414 A1* | 11/2012 | Fiolka | G02B 26/0833 355/67 |
| 2019/0056669 A1* | 2/2019 | Weidman | G03F 7/70083 |
| 2020/0020458 A1* | 1/2020 | Hosier | G03F 7/70075 |

* cited by examiner

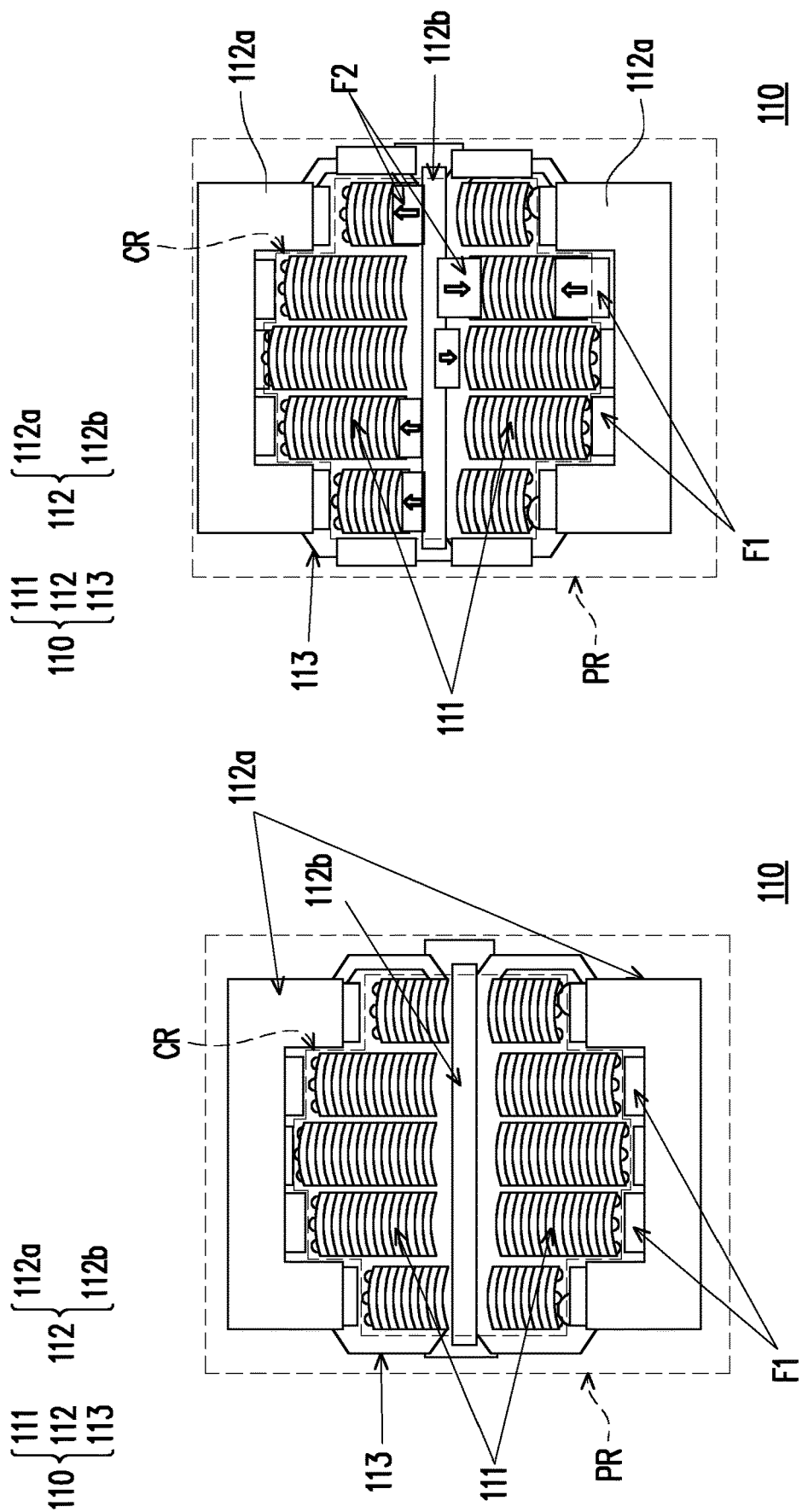

112a

112b

PHOTOLITHOGRAPHY DEVICE HAVING ILLUMINATOR AND METHOD FOR ADJUSTING INTENSITY UNIFORMITY

CROSS-REFERENCE TO RELATED APPLICATION

This application claims the priority benefit of U.S. provisional application Ser. No. 62/880,661, filed on Jul. 31, 2019. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, the need to perform higher resolution photolithography processes grows. One photolithography technique is extreme ultraviolet photolithography (EUVL). The EUVL employs scanners using light in the extreme ultraviolet (EUV) region, having a wavelength of about 1-100 nm. One type of EUV light source is laser-produced plasma (LPP). LPP technology produces EUV light by focusing a high-power laser beam onto small tin droplet targets to form highly ionized plasma that emits EUV radiation with a peak maximum emission at about 13.5 nm. The EUV light is then collected by a collector and reflected by optics towards a photolithography target substrate, e.g., a wafer. The collector is subjected to degradation due to tin contamination.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6A is schematic views illustrating the first facet mirror at a normal state according to one embodiment of the disclosure.

FIG. 6B is a schematic view illustrating the first facet mirror in FIG. 6A at a shielding state.

DESCRIPTION OF THE EMBODIMENTS

Figure 1:
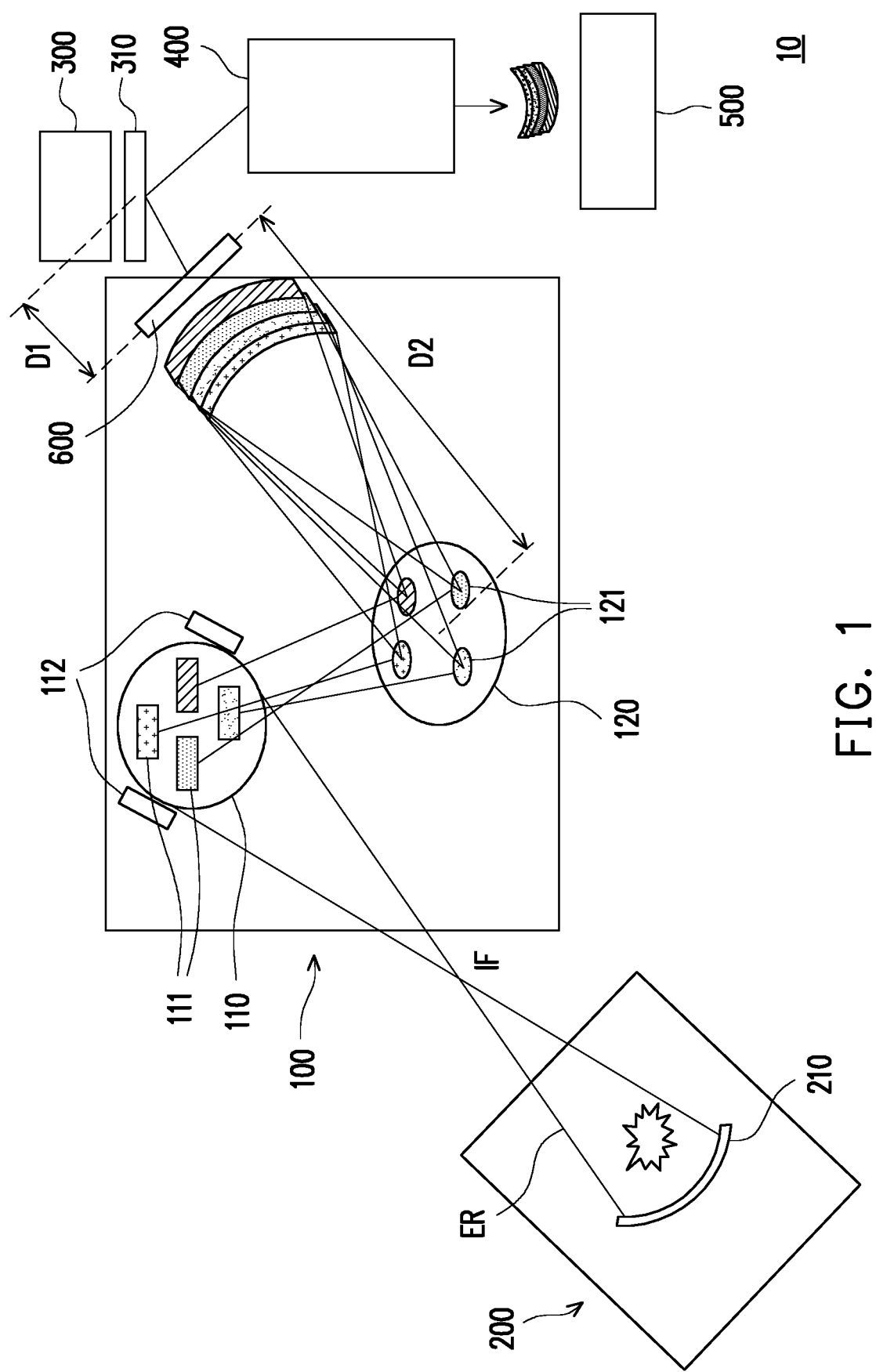
FIG. 1 is schematic view of a photolithography device according to one embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure is generally related to a photolithography device and a method for adjusting intensity uniformity of an exposure radiation generated by the photolithography device. More particularly, it is related to an apparatus and a method for reducing the effect of contamination on a collector in a radiation source of the photolithography device. The collector of the radiation source collects and reflects exposure radiation and contributes to overall conversion efficiency. However, the collector of the radiation source may be subjected to degradation due to the contamination of particles, ions, radiation, and debris deposition. In some embodiments, tin (Sn) debris is one of the contamination sources to the collector. Embodiments of the present disclosure are directed to improve intra critical dimension (CD) uniformity on a photolithography target substrate by reducing negative effect of debris contamination on the collector.

FIG. 1 is schematic view of a photolithography device according to one embodiment of the disclosure. As shown in FIG. 1, a photolithography device 10 may include an illuminator 100, a light source 200, a reticle stage 300, a projection system 400, and a wafer stage 500. The light source 200 generates and provides an exposure radiation ER to the illuminator 100. The illuminator 100 receives the exposure radiation ER from the illuminator 100 and reflects the exposure radiation ER to a reticle carried by the reticle stage 300. The exposure radiation ER propagating toward the reticle stage 300 is reflected by the reticle carried by the reticle stage 300 and is projected onto a lithography target substrate carried by the wafer stage 500 through the projection system 400. The details are provided hereinafter.

In the present embodiment, the light source 200 is an EUV light source. The light source 200 includes a collector 210. The exposure radiation ER generated by the light source 200 is an EUV radiation beam having a high energy density in an EUV wavelength range of below 50 nm. For example, the wavelength of the exposure radiation ER is smaller than 15 nm or approximately equal to 13.5 nm. Therefore, the light source 200 may be in the form of a plasma light source for generating a laser-induced plasma. In other words, the light source 200 may be a LPP source. In the LPP source, a $CO_2$ laser beam or other suitable exciting laser beam may be provided and focused onto molten tin (Sn) droplets to irradiate and excite the molten tin (Sn) droplets to generate laser-induced plasma in an excitation zone. When the molten tin (Sn) droplets is irradiated and excited by the laser beam, ions and EUV radiation are generated. In some embodiments, the light source 200 may include a droplet generator and a droplet catcher. The droplets (e.g. tin droplets) may be provided by the droplet generator and collected by the droplet catcher. The droplets (e.g. tin droplets) provided by the droplet generator may propagate from the droplet generator toward the droplet catcher. Some droplets among the droplets propagating from the droplet generator toward the droplet catcher are irradiated and excited by the laser beam to generate EUV radiation, and the other droplets among the droplets propagating from the droplet generator toward the droplet catcher are not irradiated by the laser beam and collected by the droplet catcher. In some embodiments, the light source 200 may further include a conductive magnet and an ion catcher for generating an electric field, wherein ions generated in the excitation zone may be attracted by the electric filed generated between the conductive magnet and the ion catcher and collected by the ion catcher. Further, the collector 210, which may be a collector mirror, focuses the EUV radiation of the LPP source to form the EUV radiation beam. In some embodiments, the collector 210 includes multiple reflective layers and multiple transmissive layers stacked alternately. The reflective layers in the collector 210 may be sandwiched between the transmissive layers and each reflective layer is capable of reflecting the EUV radiation beam emitted from the excitation zone respectively. The multiple reflective layers in the collector 210 contribute an overall reflection of the collector 210. In some embodiments, the collector 210 includes a Bragg reflector with multiple stacked reflective layers.

The exposure radiation ER generated by the light source 200 condenses at and passes through an intermediate focus IF and is provided to the illuminator 100. The illuminator 100 may at least include the first facet mirror 110 and the second facet mirror 120. In the illuminator 100, the exposure radiation ER propagating in the illuminator 100 is reflected by the first facet mirror 110 and the second facet mirror 120 sequentially. In some embodiments, in addition to the first facet mirror 110 and the second facet mirror 120, the illuminator 100 may include other optics (e.g., reflective mirrors). The first facet mirror 110 includes a plurality of first facet elements 111 arranged in grid, and the first facet elements 111 reflect the exposure radiation ER to the second facet mirror 120. The second facet mirror 120 includes a plurality of second facet elements 121 arranged in grid. In some embodiments, each first facet element 111 among the first facet elements 111 respectively reflects the exposure radiation ER to at least one second facet element 121 among the second facet elements 121. In some other embodiments, multiple first facet elements 111 among the first facet elements 111 reflect the exposure radiation ER to a same second facet element 121 among the second facet elements 121.

That is to say, the exposure radiation ER is manipulated to different spatial and angular distributions based on the principle of fly's eye through the first facet mirror 110 (also referred to as the field facet mirror) and the second facet mirror 120 (also referred to as the pupil facet mirror). The exposure radiation ER is split into multiple small parts by the first facet mirror 110 which composes of the first facet elements 111. Each of the first facet elements 111 may be a mirror. Afterwards, the exposure radiation ER is evenly projected over the field of view by the second facet mirror 120 which composes of the second facet elements 121. Each of the second facet elements 121 may be a mirror. Each of the first facet elements 111 in the first facet mirror 110 can be rotated individually, thus the intensity and angular distribution of exposure radiation ER reflected by the first facet mirror 110 can be controlled.

In FIG. 1, although there are four first facet elements 111 of the first facet mirror 110 and four second facet elements 121 of the second facet mirror 120 shown as an example, the numbers of the first facet elements 111 included in the first facet mirror 110 and the second facet elements 121 included in the second facet mirror 120 may be more than four. The numbers of the first facet elements 111 and the second facet elements 121 is not limited in the present invention. The exposure radiation ER is reflected by the first facet elements 111 of the first facet mirror 110, so as to be split into multiple parts. Next, the multiple parts of the exposure radiation ER propagate to the second facet elements 121 of the second facet mirror 120, respectively, and then are reflected by the second facet elements 121 to form a radiation beam, which is the exposure radiation ER after being reflected by the second facet mirror 120 and may be called a slit pattern. In other words, one of the first facet elements 111 reflects a part of the exposure radiation ER to a respective one of the second facet elements 121. However, the disclosure is not limited thereto. Further, more than one of the first facet elements 111 may reflect more than one part of the exposure radiation ER to the same second facet element 121 of the second facet mirror 120.

The exposure radiation ER reflected by the second facet mirror 120 is irradiated onto a reticle 310 carried by the reticle stage 300, and is reflected by the reticle 310. The reticle 310 may be a multilayer reflective film having a predetermined pattern to be transferred on a photoresist layer on a semiconductor wafer. The exposure radiation ER reflected by the reticle 310 is projected onto a photoresist layer formed on a semiconductor wafer (not shown) carried by the wafer stage 500 through the projection system 400 so that the pattern of the reticle 310 is projected and transferred onto the photoresist layer on the semiconductor wafer carried by the wafer stage 500. After the pattern of the reticle 310 is projected and transferred onto the photoresist layer on the semiconductor wafer carried by the wafer stage 500, the semiconductor wafer may be further processed. For example, a development, a hard baking process, a plating process, an etching process, combinations thereof, or the like may be performed on the semiconductor wafer having the patterned photoresist layer formed thereon. The performance of the photolithography device 10 is determined by resolution (or critical dimension) and critical dimension uniformity (CDU). The resolution/critical dimension is defined as the minimum feature size (e.g. width of lines, diameter of holes,) that photolithography device 10 can print onto the photoresist layer formed on the semiconductor wafer. Further, the CDU is significantly affected by the intensity uniformity of the exposure radiation ER projected onto the semiconductor wafer.

In some embodiments, the first facet mirror 110 includes the first shielding element 112 capable of adjusting intensity uniformity of the exposure radiation ER reflected by the first facet mirror 110. The first shielding element 112 shields portions of the first facet elements 111 of the first facet mirror 110 to adjust intensity uniformity of the exposure radiation ER reflected by the first facet mirror first facet mirror 110. In other words, the first shielding element 112 partially shields the first facet mirror 110 to adjust intensity uniformity of the exposure radiation ER reflected by the first facet mirror 110. In addition, the photolithography device 10 may further include a second shielding element 600 capable of adjusting intensity uniformity of the exposure radiation ER reflected by the second facet mirror 120. The second shielding element 600 is disposed on a light propagation path between the second facet mirror 120 and the reticle stage 300. The first distance D1 between the second shielding element 600 and the reticle stage 300 is less than the second distance D2 between the second shielding element 600 and the second facet mirror 120. In the present embodiment, the second shielding element 600 may be a uniformity correction module.

Figure 2B:
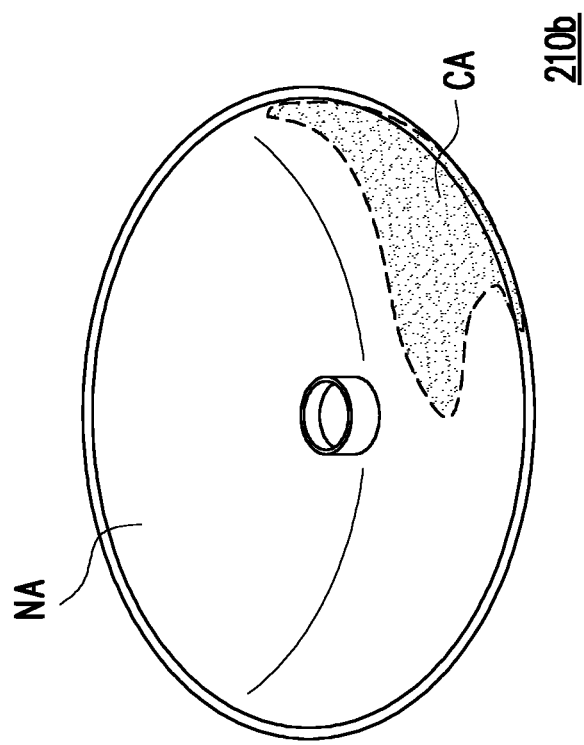
FIG. 2B is a schematic view showing a contaminated collector according to one embodiment of the disclosure.
Figure 2A:
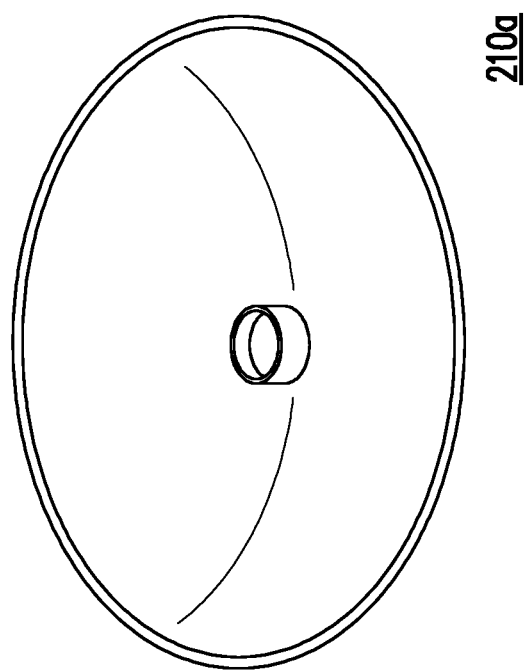
FIG. 2A is a schematic view showing a clean collector according to one embodiment of the disclosure.

After a long time of use, in the light source 200, since EUV radiation is generated by focusing the $CO_2$ laser beam onto molten tin droplets to generate plasma, tin debris deposits on a part of the collector 210. Therefore, the collector 210 is contaminated by the tin debris deposition. In other words, a part of the collector 210 is covered by tin debris or a tin layer so a contamination region is generated on a surface of the collector 210. FIG. 2A is a schematic view showing a clean collector according to one embodiment of the disclosure, and FIG. 2B is a schematic view showing a contaminated collector according to one embodiment of the disclosure. Referring to FIG. 2A and FIG. 2B at the same time, the difference between a clean collector 210a in FIG. 2A and a contaminated collector 210b in FIG. 2B is that the contaminated collector 210b has a contamination region CA and a non-contamination region NA. The contamination region CA of the contaminated collector 210b is covered by tin debris.

Further, since the collector 210 focuses the EUV radiation to form the exposure radiation ER, the contamination region CA of the collector 210 causes the unbalance in the intensity uniformity of the exposure radiation ER reflected by the second facet mirror 120. That is to say, the slit uniformity trends up or changes shape, and the unbalance tilt of the slit profile is observed. Further, the unbalance in the intensity uniformity is too large and thus cannot be corrected by the second shielding element 600, so as to make the CDU on the semiconductor wafer become worse. The unbalance tilt of the slit profile is too large to be corrected by the second shielding element 600, so that the slit uniformity becomes worse. Consequently, the intra CDU also becomes worse. The details will be provided below.

Figure 3A:
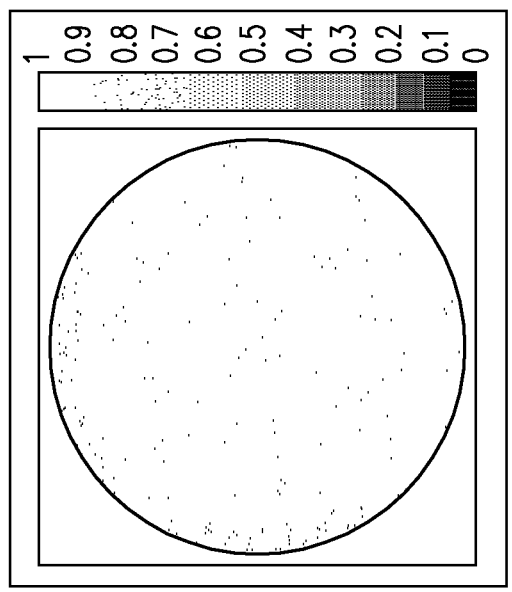
FIG. 3A is a picture showing a collector image in case that the collector is clean.
Figure 3B:
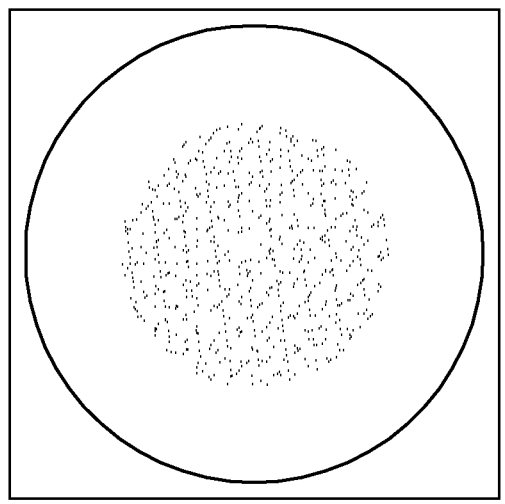
FIG. 3B is a picture showing a pupil image of the second facet mirror in case that the collector is clean.
Figure 3C:
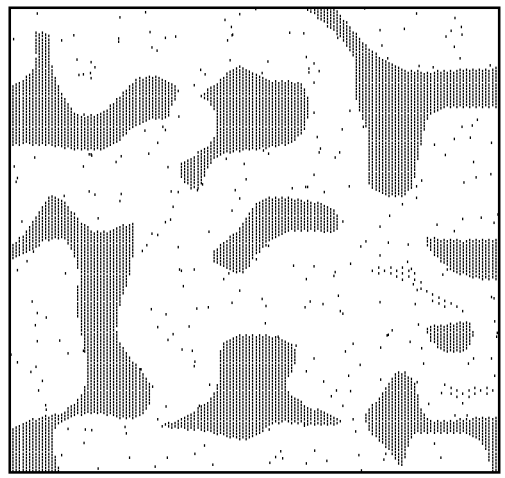
FIG. 3C is a picture showing the intra CDU on the semiconductor wafer in case that the collector is clean.
Figure 4C:
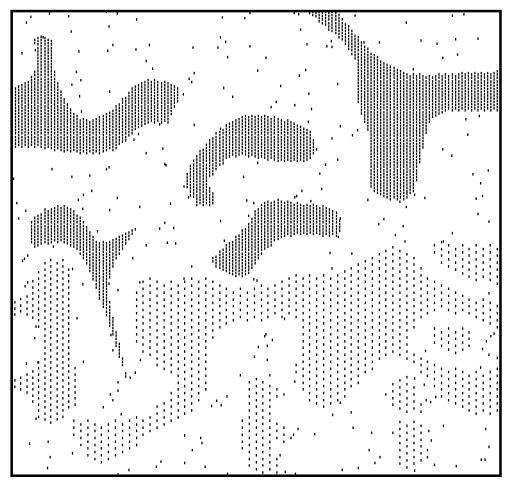
FIG. 4C is a picture showing the intra CDU on the semiconductor wafer in case that the collector is contaminated.
Figure 4B:
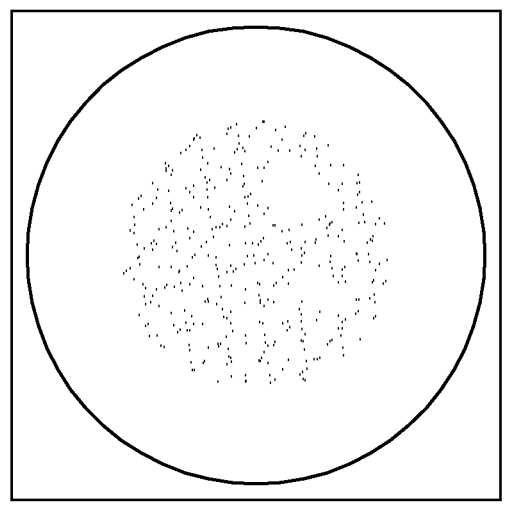
FIG. 4B is a picture showing a pupil image of the second facet mirror in case that the collector is contaminated.
Figure 4A:
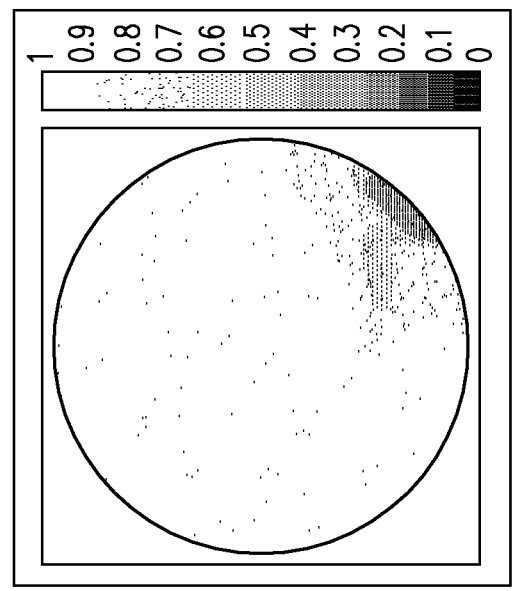
FIG. 4A is a picture showing a collector image in case that the collector is contaminated.

FIG. 3A is a picture showing a collector image in case that the collector is clean. FIG. 3B is a picture showing a pupil image of the second facet mirror in case that the collector is clean. FIG. 3C is a picture showing the intra CDU on the semiconductor wafer in case that the collector is clean. FIG. 4A is a picture showing a collector image in case that the collector is contaminated. FIG. 4B is a picture showing a pupil image of the second facet mirror in case that the collector is contaminated. FIG. 4C is a picture showing the intra CDU on the semiconductor wafer in case that the collector is contaminated. The difference between FIG. 3A and FIG. 4A is that the collector image in FIG. 4A has a contamination region. Because of this contamination region, the uniformity in the pupil image of the second facet mirror 120 as shown in FIG. 4B becomes worse than that as shown in FIG. 3B. In other words, the pupil image in case that the collector 210 is contaminated is changed in comparison to the pupil image in case that the collector 210 is clean, so as to cause unbalance slit profile. Consequently, the intra CDU on the semiconductor wafer as shown in FIG. 4C is less than that shown in FIG. 3C. The dimension (e.g., the width) of the trace on the right side of FIG. 4C is significantly greater than the dimension (e.g., the width) of the trace on the left side of FIG. 4C. In other words, the difference in dimensions of the traces in FIG. 4C is greater than that in FIG. 3C.

In order to improve the aforementioned unbalance issue, the first shielding element 112 disposed in proximity to or installed on the first facet mirror 110 (shown in FIG. 1) is controlled to shield portions of the first facet elements 111 of the first facet mirror 110 in order to adjust intensity uniformity of the exposure radiation ER reflected by the first facet mirror 110. The portions, which are shielded by the first shielding element 112, of the first facet elements 111 are corresponding to the non-contamination region of the collector 210. That is to say, a portion of the exposure radiation ER from the non-contamination region of the collector 210 is partially shielded to have a relative lower intensity. Therefore, the intensity uniformity of the entire exposure radiation ER reflected by the first facet mirror 110 becomes balance. In other words, the entire exposure radiation ER reflected by the first facet mirror 110 has a balanced intensity uniformity and propagates to the second facet mirror 120. Consequently, the exposure radiation ER reflected by the second facet mirror 120 also has a balanced intensity uniformity. In some embodiments, the second shielding element 600 may be used to adjust the intensity uniformity of the exposure radiation ER such that the intensity uniformity of the exposure radiation ER reflected from the second facet mirror 120 may be modulated to become more balance. In some alternative embodiments, when the intensity uniformity of the exposure radiation ER reflected from the second facet mirror 120 and modulated by the first shielding element 112 is already balance, the second shielding element 600 may not be used to further adjust the intensity uniformity of the exposure radiation ER. As a result, the intensity uniformity of the exposure radiation ER reflected by the second facet mirror 120 becomes balance despite the contamination region of the collector 210. That is to say, when the collector 210 is contaminated, the slit uniformity is maintained after correction.

Figure 5A:
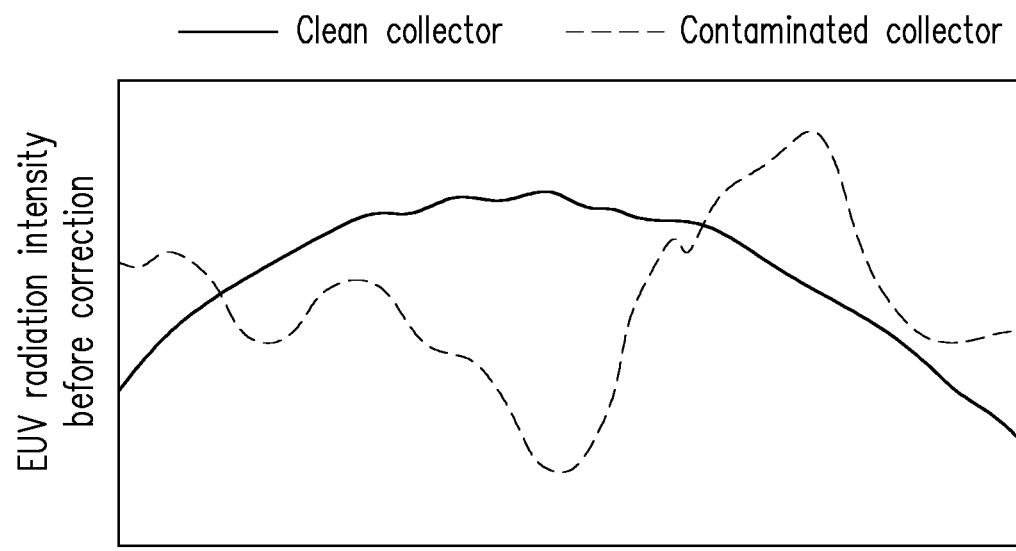
FIG. 5A is a graph illustrating a relationship before correction between the EUV radiation intensity and the slit position in both cases that the collector is clean and the collector is contaminated.
Figure 5B:
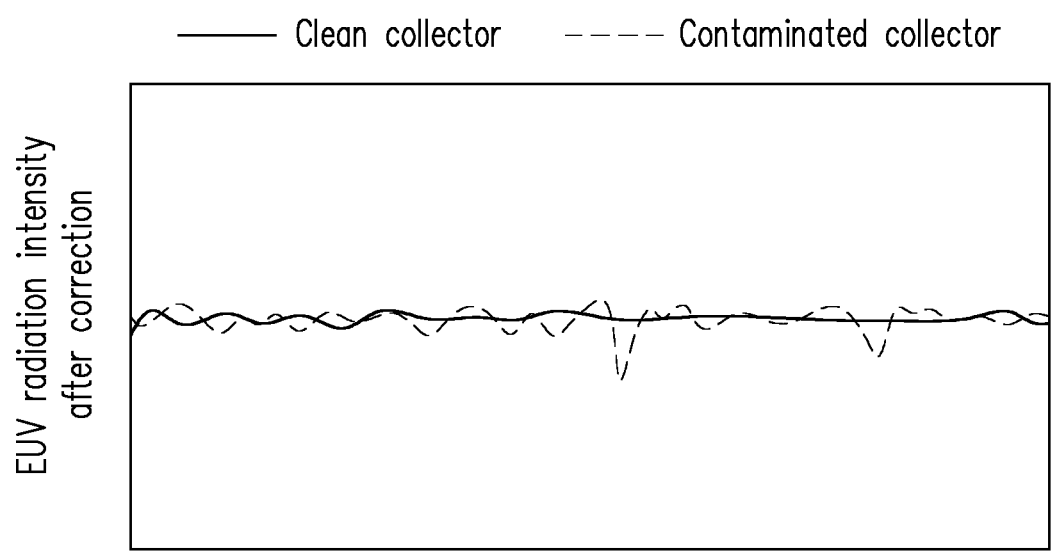
FIG. 5B is a graph illustrating a relationship after correction between the EUV radiation intensity and the slit position in both cases that the collector is clean and the collector is contaminated.

The exposure radiation ER reflected by the second facet mirror 120 may form the slit emitted from the illuminator 100, and the uniformity of the intensity of EUV radiation at the positions along the width of the slit is an important factor to achieve a high CDU on the semiconductor wafer. FIG. 5A is a graph illustrating a relationship before correction between the EUV radiation intensity and the slit position in both cases that the collector is clean and the collector is contaminated. FIG. 5B is a graph illustrating a relationship after correction between the EUV radiation intensity and the slit position in both cases that the collector is clean and the collector is contaminated. As shown in FIG. 5A, there is a significant difference in intensity at the same position of the slit between the two cases that the collector 210 is clean and the collector 210 is contaminated. As shown in FIG. 5B, the difference in intensity at the same position of the slit between the two cases that the collector 210 is clean and the collector 210 is contaminated becomes smaller. At multiple positions of the slit, the intensity of the EUV radiation does not significantly change between the two cases that the collector 210 is clean and the collector 210 is contaminated.

Consequently, the CDU on the semiconductor wafer is maintained as high over time, and thus the photolithography device 10 has a good performance after the photolithography device 10 has been used for a long time. That is to say, the lifespan of the photolithography device 10 is increased. The slit uniformity improvement is about 3%, the lifetime of the collector 210 may extend from 100 Gp to 200 Gp. Further, availability of the photolithography device 10 is improved because process maintenance (PM) frequency is reduced.

FIG. 6A is schematic views illustrating the first facet mirror at a normal state according to one embodiment of the disclosure. FIG. 6B is a schematic view illustrating the first facet mirror in FIG. 6A at a shielding state. As shown in FIG. 6A, in the present embodiment, the first facet mirror 110, which may be applied to the illuminator 100 shown in FIG. 1, includes the first facet elements 111, the first shielding element 112, and a base 113. The first facet elements 111 and the first shielding element 112 are disposed on the base 113. The first facet elements 111 are arranged in grid. In other words, the first facet elements 111 are arranged in columns on the base 113. The first facet elements 111 reflect the exposure radiation ER to the second facet mirror 120 as mentioned above.

In addition, the first shielding element 112 is installed on a central region CR and/or a periphery region PR of the first facet mirror 110. It should be noted here, the central region CR is a region that all of the first facet elements 111 are disposed within. In the present embodiment, the first shielding element 112 may be an adjustable shielding element including at least one first adjustable shielding element 112*a* and at least one second adjustable shielding elements 112*b*. As shown in FIG. 3A, the number of the first adjustable shielding elements 112*a* is two, and the number of second adjustable shielding elements 112*b* is one. The first adjustable shielding elements 112*a* are installed at/within the periphery region PR of the first facet mirror 110. The second adjustable shielding element 112*b* is installed at/within the central region CR of the first facet mirror 110. In the present embodiment, the second adjustable shielding element 112*b* is disposed at the middle of the central region CR, and the first adjustable shielding elements 112*a* are respectively disposed on two opposite sides of the central region CR. However, the disclosure is not limited thereto. In other embodiments, the second adjustable shielding element 112*b* may be disposed at any position within the central region CR, the number of the first adjustable shielding elements 112*a* may be greater than two, and the number of second adjustable shielding elements 112*b* may be greater than one.

In the present embodiment, each of the first adjustable shielding elements 112*a* includes a plurality of fingers F1, and the second adjustable shielding element 112*b* also includes a plurality of fingers F2. Each of the finger F1 and the finger F2 may have a shape of rectangular sheet, the shape of the finger F1 may be or may not be the same as the shape of the finger F2. As shown in FIG. 6A, in normal state, the finger F1 can be retracted or shrunk into the body of the first adjustable shielding element 112*a*, and the finger F2 can be retracted or shrunk into the body of the second adjustable shielding element 112*b*. In addition, as shown in FIG. 6B, in shielding state, the finger F1 can be extended or drawn out from the body of the first adjustable shielding element 112*a* to the central region CR, and the finger F2 can be extended or drawn out from the body of the second adjustable shielding element 112*b* to the central region CR. Therefore, in shielding state, the finger F1 and the finger F2 are extended to shield portions of the first facet elements 111 of the first facet mirror 110. In other words, in shielding state, the finger F1 and the finger F2 are extended to cover some of the first facet elements 111 of the first facet mirror 110. By extending and retracting the fingers F1 and F2, the intensity uniformity of the exposure radiation ER reflected by the first facet mirror 110 is adjusted.

Figure 7A:
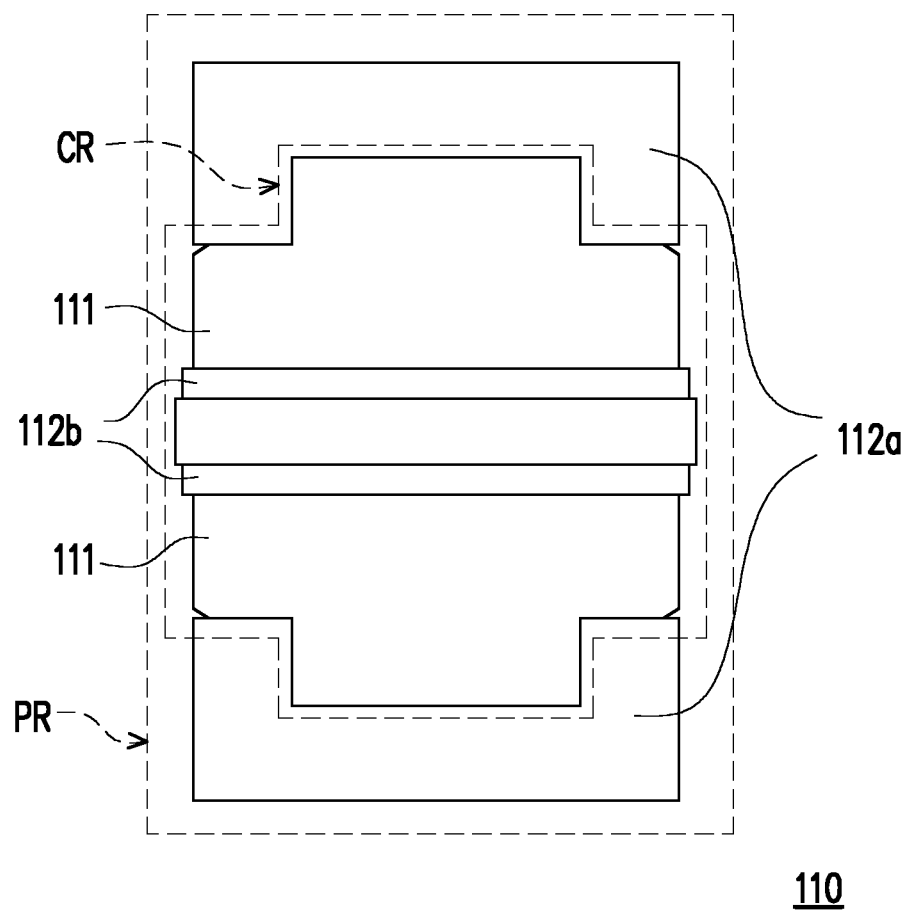
FIG. 7A is a schematic view showing the first facet mirror according to one embodiment of the disclosure.
Figure 7B:
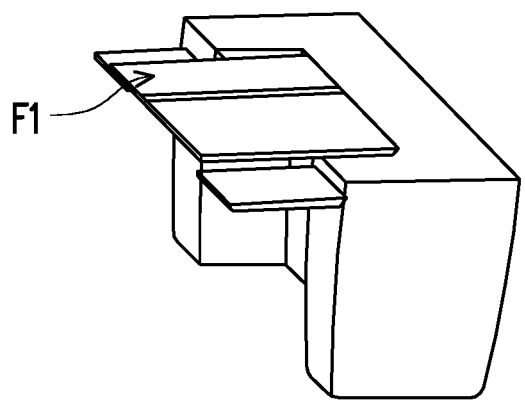
FIG. 7B is a schematic view showing the first adjustable shielding element of the first facet mirror in FIG. 7A.
Figure 7C:
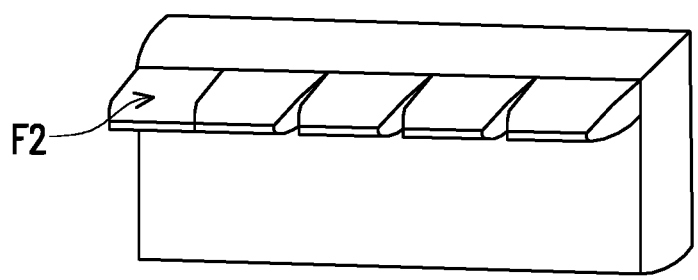
FIG. 7C is a schematic view showing the second adjustable shielding element of the first facet mirror in FIG. 7A.

FIG. 7A is a schematic view showing the first facet mirror according to one embodiment of the disclosure, FIG. 7B is a schematic view showing the first adjustable shielding element of the first facet mirror in FIG. 7A, and FIG. 7C is a schematic view showing the second adjustable shielding element of the first facet mirror in FIG. 7A. As shown in FIG. 7A, in the present embodiment, the number of the second adjustable shielding elements 112*b* is two, and the two second adjustable shielding elements 112*b* are disposed at the middle of the central region CR. The first facet elements 111 are disposed in two sub-regions in the central region CR. One first adjustable shielding element 112*a* and one second adjustable shielding elements 112*b* are disposed on two opposite sides of the same sub-region. As shown in FIG. 7B, the first adjustable shielding element 112*a* may include a body having a U shape and the fingers F1 that are adjustably installed on the U-shaped body. As shown in FIG. 7C, the second adjustable shielding element 112*b* may include a body having a sheet shape and the fingers F1 that are adjustably installed on the sheet-shaped body. The phrase "adjustably installed" means that the finger can be retracted into the body and can be extended from the body.

Based on the above, by extending and retracting the fingers F1 and F2, the intensity uniformity of the exposure radiation ER reflected by the first facet mirror 110 is adjusted. Consequently, the intensity uniformity of the exposure radiation ER reflected by the second facet mirror 120 is balance regardless of whether the collector 210 is contaminated or not.

Figure 8:
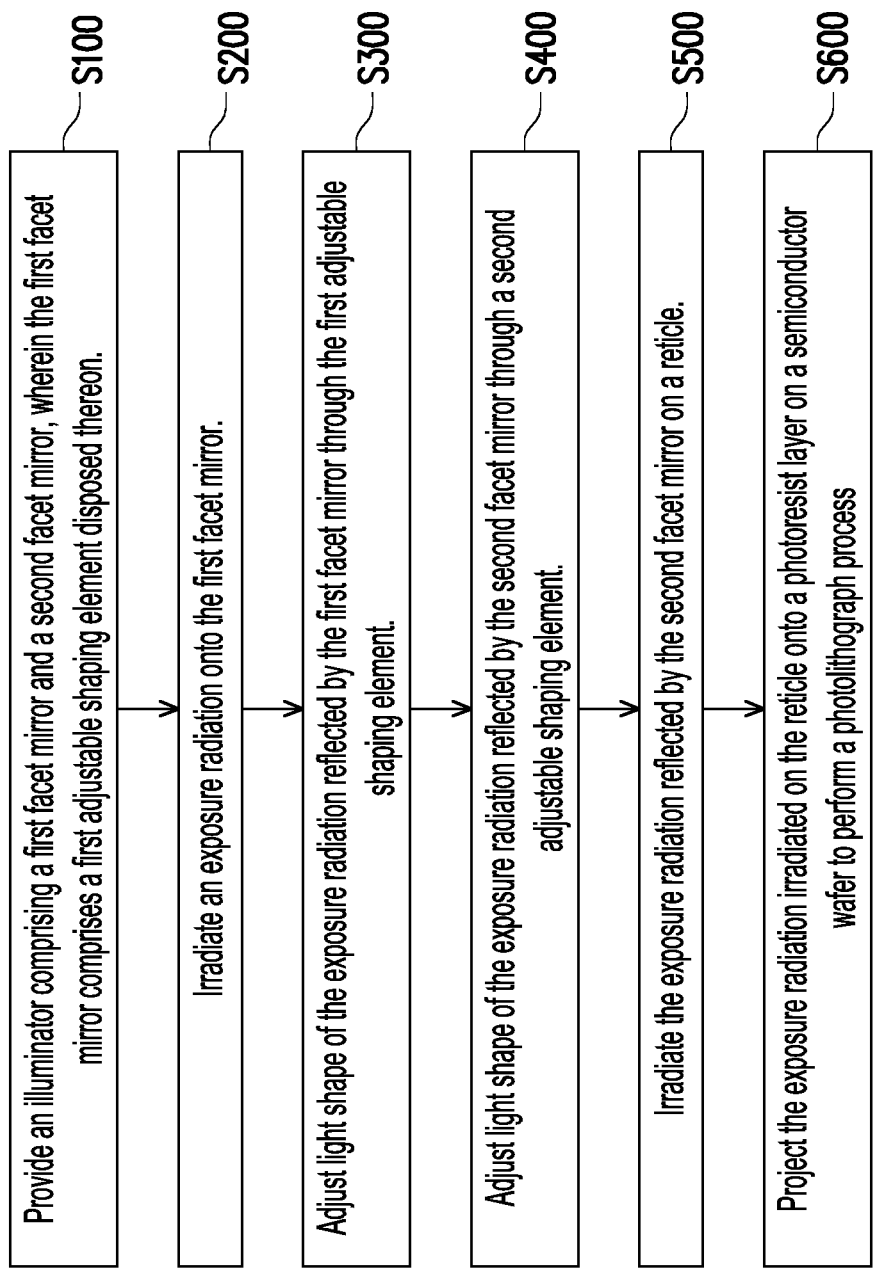
FIG. 8 is a flow chart depicting a method of adjusting the intensity uniformity of the exposure radiation according to one embodiment of the disclosure.

FIG. 8 is a flow chart depicting a method of adjusting the intensity uniformity of the exposure radiation according to one embodiment of the disclosure. As shown in FIG. 8, in step S100, the illuminator 100 including the first facet mirror 110 and the second facet mirror 120 is provided. The first facet mirror 110 includes the first shielding element 112 disposed thereon. In step S200, the exposure radiation ER is irradiated onto the first facet mirror 110. The exposure radiation ER is provided from the light source 200 including the collector 210. Next, in step S300, the intensity uniformity of the exposure radiation ER reflected by the first facet mirror 110 is adjusted through the first shielding element 112. The intensity uniformity of the exposure radiation ER reflected by the first facet mirror 110 may be adjusted based on contamination of the collector 210. That is to say, the coverage of the first shielding element 112 is adjusted to correspond to a contamination region (or non-contamination region) of the collector 210, and the first shielding element 112 is adjusted to partially shield the first facet mirror 110 in accordance with the contamination region (or non-contamination region) of the collector 210. In step S400, the intensity uniformity of the exposure radiation ER reflected by the second facet mirror 120 through the second adjustable shielding element 600. Further, in step S500, the exposure radiation ER reflected by the second facet mirror 120 is irradiated on the reticle 310. Finally, in step S600, the exposure radiation ER irradiated on the reticle 310 is projected onto a photoresist layer on a semiconductor wafer to perform a photolithograph process.

In the disclosure, since the first shielding element is controlled to adjust intensity uniformity of the exposure radiation reflected by the first facet mirror, the intensity uniformity of the exposure radiation emitting by the illuminator becomes balance despite the contamination region of the collector, so as to maintain the intra CDU on the semiconductor wafer.

According to one aspect of the disclosure, an illuminator includes a first facet mirror receiving and reflecting an exposure radiation, an adjustable shielding element disposed on the first facet mirror, the adjustable shielding element adjusting intensity uniformity of the exposure radiation reflected by the first facet mirror, and a second facet mirror receiving and reflecting the exposure radiation reflected by the first facet mirror.

In accordance with another embodiment of the disclosure, a photolithography device includes a light source providing an exposure radiation, an illuminator receiving the exposure radiation and including a first facet mirror and a second facet mirror, wherein the first facet mirror includes a first shielding element capable of adjusting intensity uniformity of the exposure radiation reflected by the first facet mirror, a reticle stage, wherein the exposure radiation propagating in the illuminator is reflected by the first facet mirror and the second facet mirror sequentially, the exposure radiation reflected by the second facet mirror is irradiated onto a reticle carried by the reticle stage, a projection system, and a wafer stage, wherein the exposure radiation reflected by the reticle is projected onto a semiconductor wafer carried by the wafer stage through the projection system.

In accordance with another embodiment of the disclosure, a method includes: providing an illuminator comprising a first facet mirror and a second facet mirror, wherein the first facet mirror comprises a first adjustable shielding element disposed thereon; irradiating an exposure radiation onto the first facet mirror; and adjusting intensity uniformity of the exposure radiation reflected by the first facet mirror through the first adjustable shielding element.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent construc-tions do not depart from the spirit and scope of the present disclosure, and that they may make various changes, substitutions, and alterations herein without departing from the spirit and scope of the present disclosure.

What is claimed is:

1. An illuminator, comprising:
a first facet mirror, receiving and reflecting an exposure radiation, the first facet mirror comprising a plurality of first facet elements arranged in a grid, and the plurality of first facet elements reflecting the exposure radiation;
a shielding element, disposed on the first facet mirror, the shielding element comprising a first adjustable shielding element installed on a central region of the first facet mirror and at least one second adjustable shielding element installed on a periphery region of the first facet mirror, the central region being surrounded by the periphery region, the at least one second adjustable shielding element comprising a first periphery adjustable shielding element and a second periphery adjustable shielding element, a first group of first facet elements among the plurality of first facet elements being surrounded by the first adjustable shielding element and the first periphery adjustable shielding element, and a second group of first facet elements among the plurality of first facet elements being surrounded by the first adjustable shielding element and the second periphery adjustable shielding element; and
a second facet mirror, receiving and reflecting the exposure radiation reflected by the plurality of first facet elements of the first facet mirror.

2. The illuminator according to claim 1, wherein the exposure radiation is an extreme ultraviolet radiation.

3. The illuminator according to claim 1, wherein the second facet mirror comprises a plurality of second facet elements arranged in a grid, and each first facet element among the plurality of first facet elements respectively reflects the exposure radiation to at least one second facet element among the plurality of second facet elements.

4. The illuminator according to claim 1, wherein the shielding element shields portions of the plurality of first facet elements of the first facet mirror.

5. The illuminator according to claim 1, wherein the first periphery adjustable shielding element and the second periphery adjustable shielding element respectively comprises movable fingers capable of extending toward the first adjustable shielding element.

6. The illuminator according to claim 5, wherein
the first adjustable shielding element comprises first movable fingers and second movable fingers, the first movable fingers are capable of extending toward the first periphery adjustable shielding element to partially shield the first group of first facet elements, and the second movable fingers are capable of extending toward the second periphery adjustable shielding element to partially shield the second group of first facet elements.

7. A photolithography device, comprising:
a light source, providing an exposure radiation;
an illuminator, receiving the exposure radiation and comprising a first facet mirror and a second facet mirror, wherein the first facet mirror comprises a shielding element and a plurality of first facet elements arranged in a grid, the shielding element comprising at least one first adjustable shielding element installed on a central region of the first facet mirror and at least one second adjustable shielding element installed on a periphery region of the first facet mirror, the central region being surrounded by the periphery region, the at least one second adjustable shielding element comprising a first periphery adjustable shielding element and a second periphery adjustable shielding element, a first group of first facet elements among the plurality of first facet elements being surrounded by the first adjustable shielding element and the first periphery adjustable shielding element, and a second group of first facet elements among the plurality of first facet elements being surrounded by the first adjustable shielding element and the second periphery adjustable shielding element;
- a reticle stage, wherein the exposure radiation propagating in the illuminator is reflected by the first facet mirror and the second facet mirror sequentially, and the exposure radiation reflected by the second facet mirror is irradiated onto a reticle carried by the reticle stage;
- a projection system; and
- a wafer stage, wherein the exposure radiation reflected by the reticle is projected onto a semiconductor wafer carried by the wafer stage through the projection system.

8. The photolithography device according to claim 7, further comprising a second shielding element, wherein the second shielding element is disposed on a light propagation path between the second facet mirror and the reticle stage.

9. The photolithography device according to claim 8, wherein a first distance between the second shielding element and the reticle stage is less than a second distance between the second shielding element and the second facet mirror.

10. The photolithography device according to claim 7, wherein the exposure radiation is an extreme ultraviolet radiation.

11. The photolithography device according to claim 7, wherein the second facet mirror comprises a plurality of second facet elements arranged in a grid, and each first facet element among the first facet elements respectively reflects the exposure radiation to at least one second facet element among the second facet elements.

12. The photolithography device according to claim 7, wherein the shielding element shields portions of the first facet elements of the first facet mirror.

13. The photolithography device according to claim 7, wherein the first periphery adjustable shielding element and the second periphery adjustable shielding element respectively comprises movable fingers capable of extending toward the first adjustable shielding element.

14. The photolithography device according to claim 7, wherein the first adjustable shielding element comprises first movable fingers and second movable fingers, the first movable fingers are capable of extending toward the first periphery adjustable shielding element to partially shield the first group of first facet elements, and the second movable fingers are capable of extending toward the second periphery adjustable shielding element to partially shield the second group of first facet elements.

15. A method, comprising:
- providing an illuminator comprising a first facet mirror and a second facet mirror, wherein the first facet mirror comprises a shielding element disposed thereon, the shielding element comprises at least one first adjustable shielding element installed on a central region of the first facet mirror and at least one second adjustable shielding element installed on a periphery region of the first facet mirror, the central region is surrounded by the periphery region, the at least one second adjustable shielding element comprises a first periphery adjustable shielding element and a second periphery adjustable shielding element, a first group of first facet elements among the plurality of first facet elements are surrounded by the first adjustable shielding element and the first periphery adjustable shielding element, and a second group of first facet elements among the plurality of first facet elements are surrounded by the first adjustable shielding element and the second periphery adjustable shielding element;
- irradiating an exposure radiation onto the first facet mirror and the shielding element; and
- adjusting intensity uniformity of the exposure radiation reflected by the first facet mirror through the first adjustable shielding element.

16. The method according to claim 15, wherein the exposure radiation is provided from a light source comprising a collector, and the intensity uniformity of the exposure radiation reflected by the first facet mirror is adjusted based on contamination of the collector.

17. The method according to claim 16, wherein the exposure radiation is an extreme ultraviolet radiation, the exposure radiation is provided from a light source comprising a collector, and coverage of the first adjustable shielding element is adjusted to correspond to a non-contamination region of the collector.

18. The method according to claim 17, wherein the first adjustable shielding element is adjusted to partially shield the first facet mirror in accordance with the contamination region of the collector.

19. The method according to claim 15, further comprising:
- adjusting intensity uniformity of the exposure radiation reflected by the second facet mirror through a second adjustable shielding element.

20. The method according to claim 15, further comprising:
- irradiating the exposure radiation reflected by the second facet mirror on a reticle; and
- projecting the exposure radiation irradiated on the reticle onto a photoresist layer on a semiconductor wafer to perform a photolithography process.

* * * * *